United States Patent
Joshi et al.

(10) Patent No.: US 7,414,843 B2
(45) Date of Patent: Aug. 19, 2008

(54) METHOD AND APPARATUS FOR A LAYERED THERMAL MANAGEMENT ARRANGEMENT

(75) Inventors: Yogendra Joshi, Decatur, GA (US); Xiaojin Wei, Norcross, GA (US); Michael K. Patterson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 419 days.

(21) Appl. No.: 11/077,634

(22) Filed: Mar. 9, 2005

(65) Prior Publication Data
US 2005/0200001 A1 Sep. 15, 2005

Related U.S. Application Data

(60) Provisional application No. 60/552,102, filed on Mar. 10, 2004.

(51) Int. Cl.
*H05K 7/20* (2006.01)
*H01L 23/34* (2006.01)
*F28D 15/00* (2006.01)

(52) U.S. Cl. ............... 361/699; 257/714; 174/15.1; 165/80.4; 165/104.33

(58) Field of Classification Search ........... 174/15.1, 174/15.2, 252; 257/714; 361/699; 165/80.4, 165/80.5, 104.33
See application file for complete search history.

(56) References Cited

U.S. PATENT DOCUMENTS

| | | | |
|---|---|---|---|
| 3,901,731 A * | 8/1975 | Warszawski et al. | 429/9 |
| 4,573,067 A | 2/1986 | Tuckerman et al. | |
| 5,099,910 A | 3/1992 | Walpole et al. | |
| 5,727,618 A * | 3/1998 | Mundinger et al. | 165/80.4 |
| 6,301,109 B1 | 10/2001 | Chu et al. | |
| 6,457,515 B1 | 10/2002 | Vafai et al. | |
| 2001/0020365 A1* | 9/2001 | Kubo et al. | 62/1 |
| 2003/0213580 A1* | 11/2003 | Philpott et al. | 165/46 |

* cited by examiner

*Primary Examiner*—Jayprakash N Gandhi
*Assistant Examiner*—Zachary M Pape
(74) *Attorney, Agent, or Firm*—Schwabe, Williamson & Wyatt, P.C.

(57) ABSTRACT

Embodiments of the present invention include an apparatus, method, and system for providing a layered thermal management arrangement. Embodiments of the present invention provide a layered thermal management arrangement, including a plurality of first channels, one or more flow-regulation features having a first and second manifold to provide and regulate at least a portion of a first fluid flow to the plurality of first channels and to drain at least the portion of the first fluid flow from the plurality of first channels. Other embodiments may be described and claimed.

18 Claims, 5 Drawing Sheets

METHOD AND APPARATUS FOR A LAYERED THERMAL MANAGEMENT ARRANGEMENT

RELATED APPLICATIONS

This application claims priority to U.S. Provisional Application No. 60/552,102, entitled "Stacked Microchannel Heat Sinks," deposited by Express Mail on Mar. 10, 2004, which is hereby fully incorporated by reference.

FIELD

Disclosed embodiments of the present invention relate to the field of thermal management, and more particularly to providing a layered thermal management arrangement for managing heat in heat sensitive devices.

BACKGROUND

The task of thermal management for microelectronic devices has been increasingly challenging, partly as a result of advances in integration and performance of integrated circuits. Thermal management is especially important in the operation of silicon microprocessors as relentlessly increasing frequency targets push power output, and therefore heat generation, to the limits of the cooling capacity of passive air-cooled heatsink technology. Insufficient heat transfer can result in degradation in performance and reliability of those devices or circuits.

Recent focus has turned to thermal management arrangements utilizing fluid flowing through microchannels to dissipate heat. Usually in a closed-loop arrangement, coolant such as water is pumped through the microchannels to take away the heat generated. However, despite the many efforts devoted to develop effective microchannel cooling solutions, there exists a need to improve the current state-of-the-art to achieve smaller pressure drop, and better fluid distribution.

BRIEF DESCRIPTION OF THE DRAWINGS

Embodiments of the invention are illustrated by way of example and not by way of limitation in the figures of the accompanying drawings, in which the like references indicate similar elements and in which.

DETAILED DESCRIPTION

Illustrative embodiments of the present invention include a layered thermal management arrangement for transferring heat between a heat source and a heat sink.

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the embodiments of the present invention. It should also be noted that directions and references (e.g., up, down, top, bottom, left, right, etc.) may be used to facilitate the discussion of the drawings and are not intended to restrict the application of the embodiments of this invention. Therefore, the following detailed description is not to be taken in a limiting sense and the scope of the embodiments of the present invention are defined by the appended claims and their equivalents.

Figure 1:
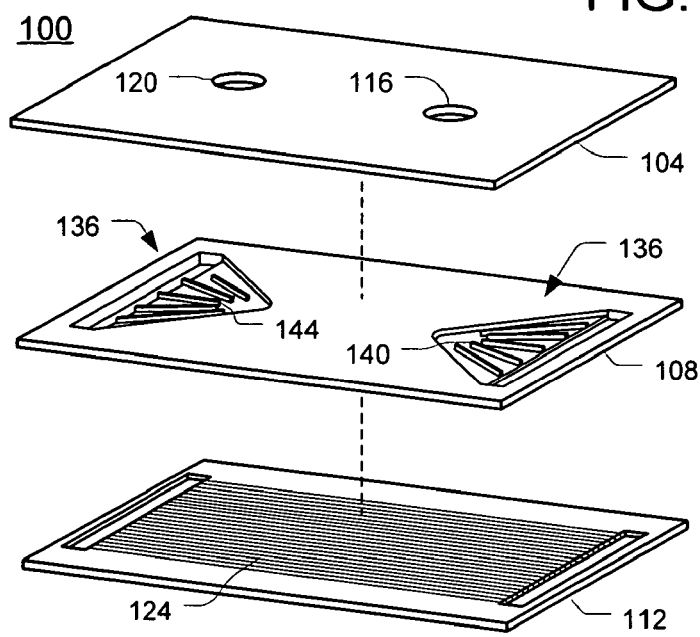
FIG. 1 illustrates an exploded perspective view of a layered thermal management arrangement in accordance with an embodiment of the present invention.

FIG. 1 illustrates an exploded perspective view of a layered thermal management arrangement 100 in accordance with an embodiment of the present invention. In particular, the thermal management arrangement 100 may include three substrate layers 104, 108, and 112 coupled to one another, at respective faces, as shown. The substrate layers 104, 108, and 112 may be planar and substantially parallel to one another when assembled. Each of these substrate layers 104, 108, and 112 may be constructed from a semiconductor material, e.g., silicon. Construction from a semiconductor material may allow for etching techniques of the semiconductor arts to facilitate the creation of the features, to be discussed below, within the dimensional constraints imposed by various embodiments.

In one embodiment, the substrate layer 104 may be a top layer that has an opening 116 and an opening 120. The openings 116 and 120 may allow for influent and effluent fluid flows through the substrate layer 104. Each of the openings 116 and 120 may be coupled to an inlet tube or an outlet tube (not shown).

In one embodiment, the substrate layer 112 may be a channel-substrate layer having a plurality of channels 124. The plurality of channels 124 may be substantially parallel to one another, and in one embodiment may include substantially the same dimensions, although this may not be the case in other embodiments. In one embodiment at least one channel of the plurality of channels 124 may have a rectangular cross section with a cross-sectional linear dimension of less than a millimeter. For example, in one embodiment the channel may have a width of approximately 25 micrometers and a height of approximately 300 micrometers.

In one embodiment, the substrate layer 108 may be a manifold-substrate layer having one or more flow regulation features 136. The one or more flow regulation features 136 may provide and regulate a fluid flow to the plurality of channels 124. Additionally the one or more flow regulation features 136 may drain the fluid flow from the plurality of channels 124. As shown in FIG. 1, the one or more flow regulation features 136 may be divided into two functional sets that may serve, e.g., as an inlet and outlet functional sets. Functional sets of flow regulation features may hereinafter also be referred to as manifolds.

In one embodiment, the opening 116 may be coupled to an inlet tube in order to receive an influent fluid flow. In various embodiments, the fluid may be any type of heat transferable fluid such as but not limited to a gas (e.g., air) and a liquid (e.g., water, alcohol, perfluorinated liquids, etc.). The opening 116 may be flow coupled to an inlet manifold 140. The inlet manifold 140 may provide and regulate the fluid flow to the plurality of channels 124 in the substrate layer 112.

In one embodiment, an outlet manifold 144 may drain the fluid flow from the plurality of channels 124 in the substrate layer 112. The outlet manifold 144 may be flow coupled with the opening 120, which may, in turn, be coupled with the outlet tube.

In another embodiment, one or more additional channel substrate layers, similar to the substrate layer 112, may be coupled to the substrate layer 112. These additional channel substrate layers may also be flow coupled to the one or more flow regulation features 136 of the substrate layer 108.

The discussion of the fluid flow through the thermal management arrangement 100 may be for purposes of describing the illustrated flow coupling relationships. In other embodiments, the inlet and outlet tubes coupled to the openings 116 and 120 may be reversed, thereby reversing the flow throughout the entire thermal management arrangement 100. Likewise, descriptors such as inlet/outlet, e.g., as applied to the manifolds 140 and 144, may be used to facilitate discussion of the illustrated embodiment and may be substantially interchangeable in other embodiments, unless otherwise stated.

Figure 2:
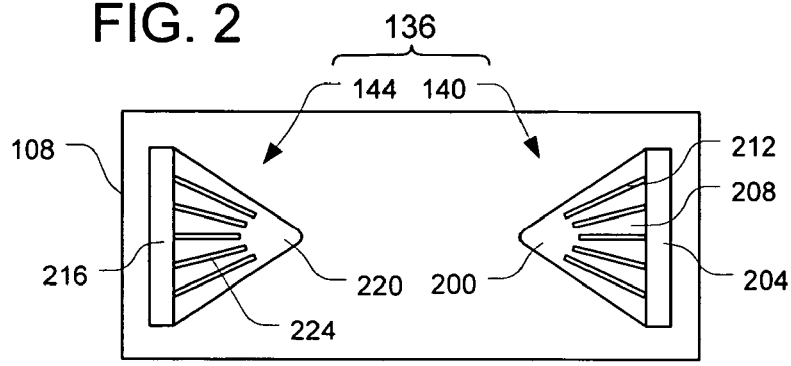
FIG. 2 illustrates a manifold substrate layer in accordance with an embodiment of the present invention.

FIG. 2 illustrates the manifold substrate layer 108 in accordance with an embodiment of the present invention. In this embodiment, the manifold 140 may have a first end 200, a second end 204, and number of flow corridors 208 coupling the first end 200 to the second end 204. The flow corridors 208 may be separated and defined by ribs 212. The ribs 212 may help direct the flow as well as provide support to the substrate layer 104 that is coupled to the manifold substrate layer 108. In various embodiments the flow corridors 208 may facilitate the concentration or diffusion of a fluid flow.

In this embodiment, the first end 200 may provide a flow-concentrated interface with the first opening 116. The second end 204, which may be a trench opening as shown, may provide a flow-distributive interface with an end of the channels 124 of the channel substrate layer 112.

In one embodiment, the manifold 144 may be substantially symmetrical with the manifold 140, including a trench opening 216, a flow-concentrated end 220, a flow corridor 224 between the two.

Figure 3:
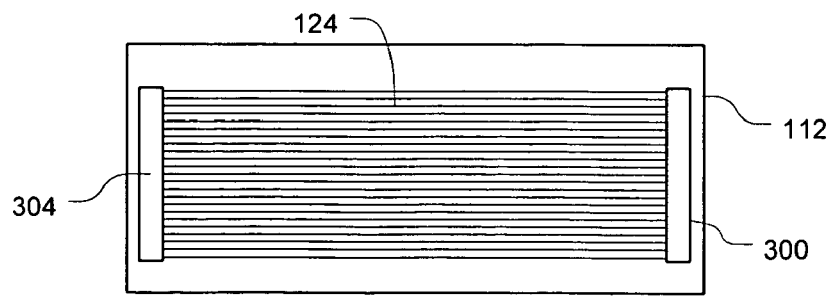
FIG. 3 illustrates a channel substrate layer in accordance with an embodiment of the present invention.

FIG. 3 illustrates the channel substrate layer 112 in accordance with an embodiment of the present invention. In this embodiment, the plurality of channels 124 may be substantially parallel to one another as shown. Each of the plurality of channels 124 may have a first end disposed at a trough 300 and a second end at a trough 304. The trough 300 may be at the flow-distributive interface with the trench opening 204, while the trough 304 may be disposed at a flow distributive interface with the trench opening 216. As shown, each of the plurality of channels 124 have ends that share the two troughs 300 and 304; however, other embodiments, may have one or more partitions in the trough 300 and/or 304.

Figure 4:
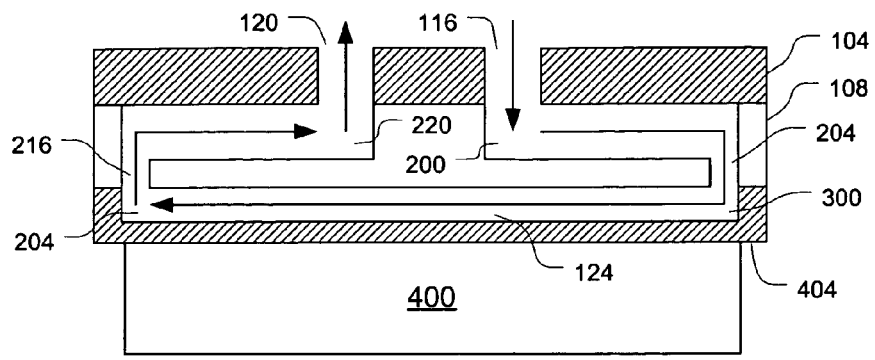
FIG. 4 illustrates fluid flow through a cross-sectional view of the thermal management arrangement in accordance with an embodiment of the present invention.

FIG. 4 illustrates fluid flow through a cross-sectional view of the thermal management arrangement 100 in accordance with an embodiment of the present invention. In this embodiment, a fluid flow may enter the opening 116 of the first substrate layer 104. The first end 200 of the manifold 140 may receive the flow in a first direction, which may be substantially orthogonal to the plane of the substrate layer 108, and redirect it in a second direction towards the trench opening 204. As the fluid flows in the plane of the substrate layer 108 from the first end 200 to the trench opening 204 it may be diffused by the flow corridors. The trench opening 204, which may interface with the trough 300 and the channel 124 of the substrate layer 112, may receive the fluid flow and redirect it towards the channel 124 in a third direction, which may also be substantially orthogonal to the plane of the substrate layer 108. The fluid may then flow through the channel 124 in the plane of the substrate layer 112.

In one embodiment, a heat source 400 may be coupled to a surface 404 of the substrate layer 112. At least a portion of the heat generated by the heat source 400 may be conducted through the substrate layer 112 and absorbed in the fluid flowing through the channel 124. The heated fluid may then drain from the substrate layer 112 through the trench opening 216 in a direction opposite the third direction. The heated fluid may be concentrated by the flow corridors 224 of the manifold 144 in the plane of the substrate layer 108 as it travels toward the flow-concentrated end 220. The heated fluid may then be emitted out of the thermal management device 100 through the opening 120. The heat absorbed by the fluid flow may then be dissipated at a location away from the heat source 400.

In another embodiment, the heat source 400 may instead be a heat sink, which the fluid flow may deliver heat to.

Figure 5:
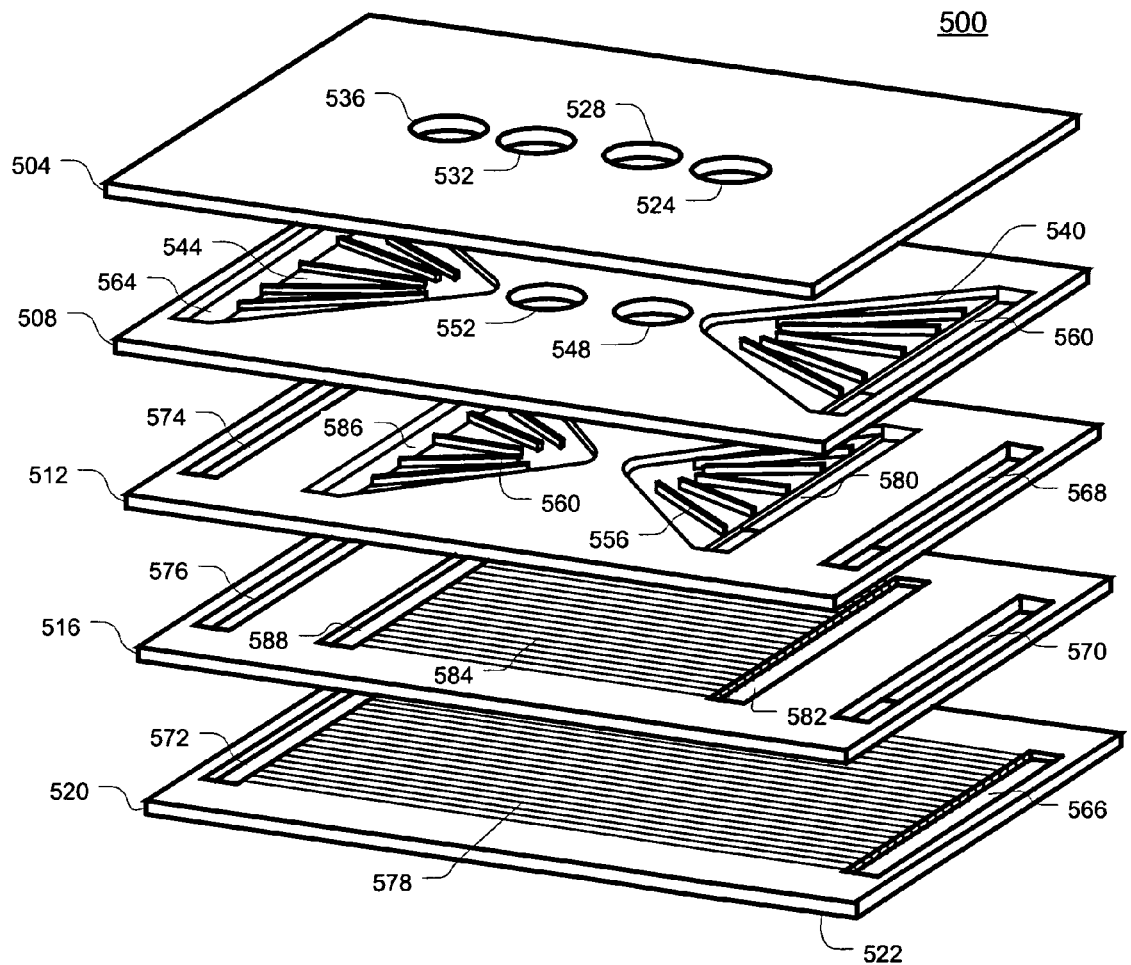
FIG. 5 illustrates an exploded perspective view of a layered thermal management arrangement in accordance with another embodiment of the present invention.

FIG. 5 illustrates an exploded perspective view of a layered thermal management arrangement 500 in accordance with another embodiment of the present invention. In particular, this embodiment may include substrate layers 504, 508, 512, 516, and 520 coupled to one another as shown. The thermal management arrangement 500 may also have a surface 522 adapted to couple to a heat source or a heat sink (neither shown). The substrate layers 504, 508, 512, 516, and 520 may include features similar to like-named features discussed with reference to substrate layers 104, 108, and 112.

The substrate layer 504 may include openings 524, 528, 532, and 536 adapted to be coupled to respective inlet or outlet tubes. The openings 524 and 536 may be flow coupled to flow-concentrated ends of manifolds 540 and 544, respectively, of the substrate layer 508. The openings 528 and 532 may be flow coupled to respective openings 548 and 552 of the substrate layer 508. The openings 548 and 552 may be flow coupled to flow-concentrated ends of manifolds 556 and 560, respectively, of the substrate layer 512.

In one embodiment, the manifolds 540 and 544 may have, at their respective flow-distributed ends, trench openings 560 and 564. The trench opening 560 may be flow coupled to a trough 566 through like-dimensioned trench openings 568 and 570 in the substrate layers 512 and 516, respectively. In one embodiment, one or more flow regulation features may be additionally/alternatively provided in the trench openings 568 and 570.

The trench opening 564 may be flow coupled to a trough 572 through like-dimensioned trench openings 574 and 576 in the substrate layers 512 and 516, respectively. The troughs 566 and 572 may be flow coupled to one another through a plurality of channels 578 of the substrate 520.

In this manner, the trench opening 560 may provide a flow-distributive interface to the trough 566 and channels 578 of the substrate layer 520 through the substrate layers 512 and 516. Similarly, the trench opening 564 may provide a flow-distributive interface to the trough 572 and channels 578 of the substrate layer 520 through the substrate layers 512 and 516.

In one embodiment, the manifold 556 may have a trench opening 580 at its flow-distributed end. The trench opening 580 may provide a distributed flow interface with a trough 582 and channels 584 of the substrate layer 516. Likewise, the manifold 560 may have a trench opening 586 at its flow-distributed end to provide a flow-distributive interface with a trough 588 and the channels 584 of the substrate layer 516.

Figure 6:
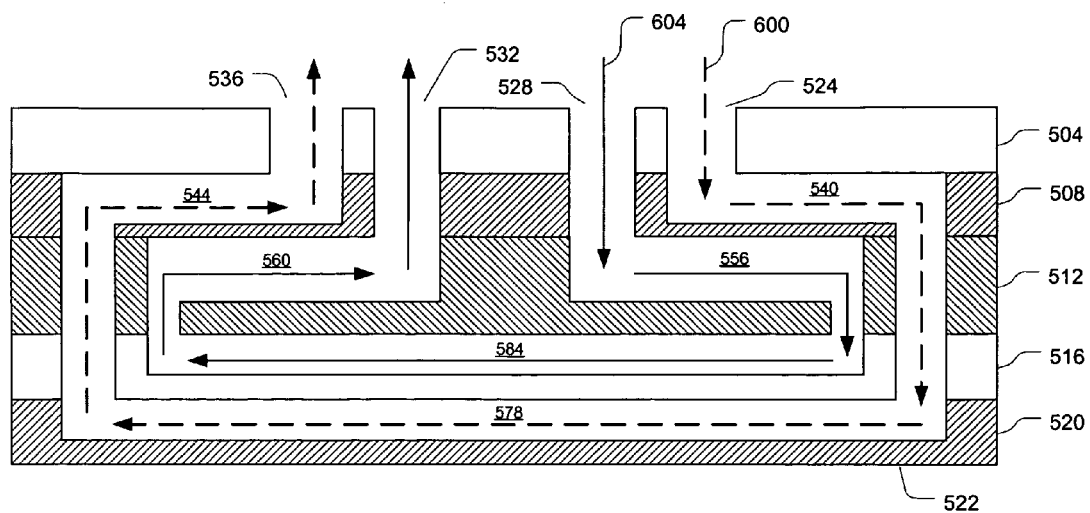
FIG. 6 illustrates fluid flow through a cross-sectional view of the thermal management arrangement in a like-direction manner in accordance with an embodiment of the present invention.

FIG. 6 illustrates fluid flow through a cross-sectional view of the thermal management arrangement 500 in a like-direction manner in accordance with an embodiment of the present invention. In this embodiment a first fluid flow 600 may be provided to the thermal management arrangement 500 as an influent flow at the opening 524. Briefly, the fluid flow 600 may be regulated, e.g., diffused and redirected, by the manifold 540 and provided to the channel 578 through the substrate layers 512 and 516. Conversely, the fluid flow 600 may be drained from the channel 578 by the manifold 544 through the substrate layers 516 and 512, and emitted from the opening 536 as an effluent flow.

A second fluid flow 604 may be provided to the thermal management arrangement 500 as an influent flow at the opening 528. Briefly, the second fluid flow 604 may be regulated, e.g., diffused and redirected, by the manifold 556 and provided to the channel 584. Conversely, the second fluid flow 604 may be drained from the channel 584 by the manifold 560 and emitted from the opening 532 as an effluent flow.

The manner of fluid flow in this embodiment may be referred to as a like-direction manner because the fluid flows 600 and 604 travel in substantially the same direction through parallel channels 578 and 584, respectively.

Figure 7:
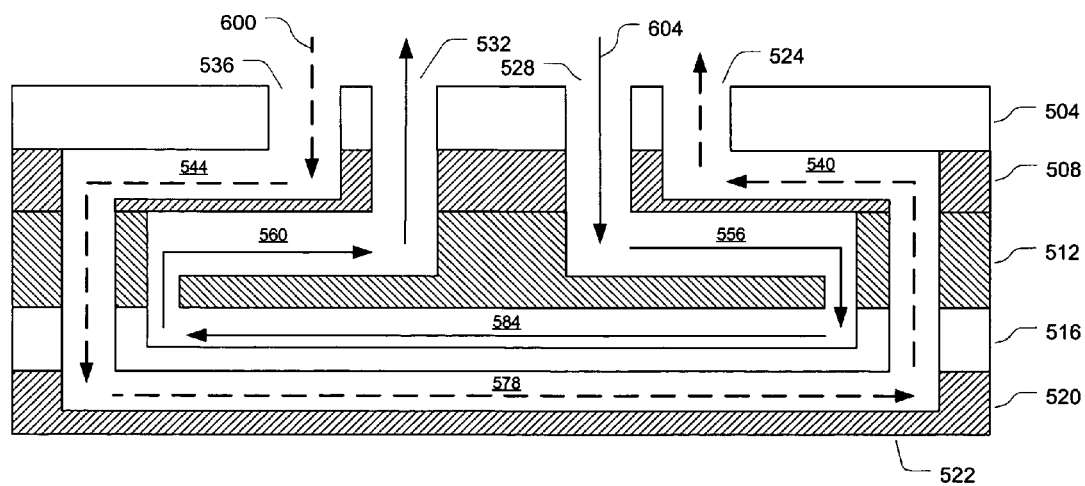
FIG. 7 illustrates fluid flow through a cross-sectional view of the thermal management arrangement in a counter-flow manner in accordance with an embodiment of the present invention.

FIG. 7 illustrates fluid flow through a cross-sectional view of the thermal management arrangement 500 in a counter-flow manner in accordance with an embodiment of the present invention. In this embodiment the inlet tube providing the first fluid flow 600 may be coupled to the opening 536, while the inlet tube providing the second fluid flow 604 may be coupled to the opening 528. This may result in the first fluid flow 600 through the channel 578 being counter to, or substantially the opposite direction as, the second fluid flow 604 through the channel 584.

In the embodiments depicted in FIGS. 6 and 7, the first fluid flow 600 may be substantially independent from the second fluid flow 604. This may facilitate individual control of the flow distribution through the separate substrate layers 516 and 520. This flexibility may accommodate different applications by adjusting the flow rate ratios between the first and the second fluid flows 600 and 604.

In one embodiment the fluid flow 600 through the channel 578 may have the opportunity to remove a greater portion of the excess heat generated at the surface 522 because of its proximity to the source. Any heat above the heat transfer capabilities of the first fluid flow 600 may then be transferred to the substrate layer 516 where the second fluid flow 604 may have an opportunity to transfer it. Because the first fluid flow 600 may collect more heat than the second fluid flow 604, if its heat capabilities allow, it may also need to dissipate more heat. Therefore, in one embodiment the second fluid flow 604 may be cycled through at a faster rate than the first fluid flow 600.

Excess heat generated by a heat source coupled to the thermal management arrangement 500 may encounter three types of thermal resistances: conduction resistance through the substrate layer 520 and possibly the substrate layer 516; convection resistance; and bulk resistance due to the fluid temperature rise. In an embodiment where the substrate layers are composed of a material with high thermal conductivity, the conduction resistance may be of less concern than the convection and bulk resistances. In an embodiment with single-phase laminar flow, the heat transfer coefficient may be higher near the entrance region of the channel substrate layers 516 and 520. Along the flow direction, as the boundary layer becomes more developed and thicker, the heat transfer coefficient may decrease. This may cause an increase in the convective resistance along the flow direction.

In one embodiment, the heat flux may be greater near the entrance region, e.g., when the heat source has an uneven heat distribution. An uneven heat distribution may be the result of certain areas of a semiconductor package being more active than other areas (for example, the core logic area may generate more heat than the cache). In this embodiment the like-direction flow of the FIG. 6 embodiment may provide a substantial portion of its overall heat transfer capabilities to that region. This may be particularly true for large flow-rate embodiments, where the bulk resistance is not too dominant.

In another embodiment, the heat flux may be more uniform across the face of the surface 522. In this embodiment, the counter-flow manner of the FIG. 7 embodiment may facilitate a reduction in the variation of the convective resistance and/or bulk resistance (primarily with small flow rates) along the flow direction.

The flow ratios and/or flow directions may be varied to address particular objectives and/or implementation characteristics of an embodiment.

Figure 8:
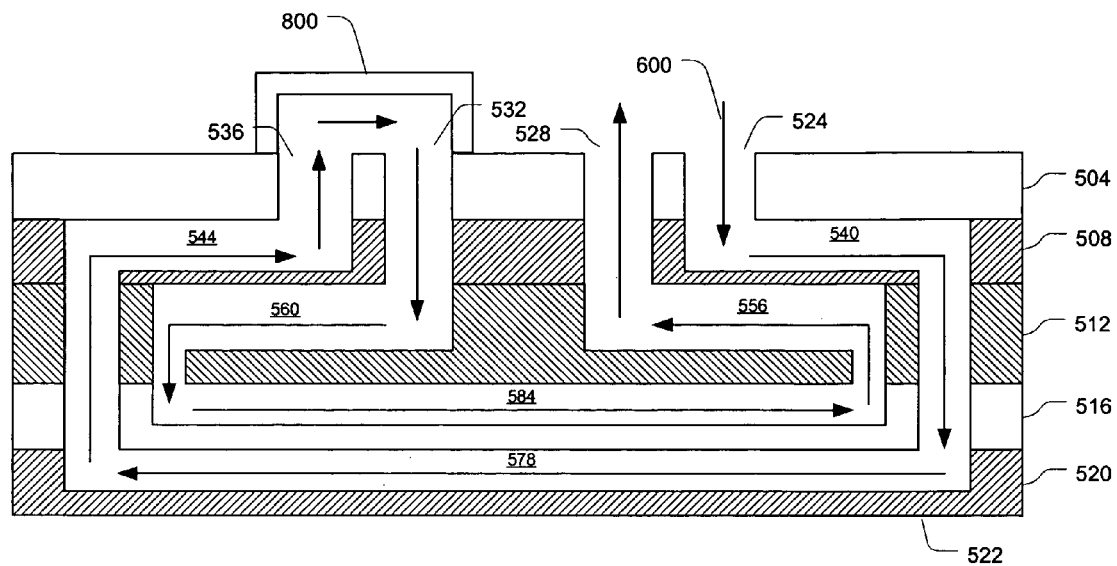
FIG. 8 illustrates fluid flow through a cross-sectional view of the thermal management arrangement in a serial manner in accordance with an embodiment of the present invention.

FIG. 8 illustrates fluid flow through a cross-sectional view of the thermal management arrangement 500 in a serial manner in accordance with an embodiment of the present invention. In this embodiment the first fluid flow 600 may be provided to the opening 524 and may be emitted at the opening 536. A U-coupler 800 may be positioned at the opening 536 to redirect the first fluid flow 600 back into the opening 532. After travelling through the channel 584 the first fluid flow may be emitted at the opening 528. In this embodiment, one fluid flow is serial directed through the features of the thermal management arrangement 500. The manner of fluid flow at the adjacent channel substrate layers 516 and 520 may be a counter-flow manner similar to the embodiment described with reference to FIG. 7.

Because there is only one fluid flow 600 in this embodiment, only one inlet tube and one outlet tube may be needed.

The thermal management arrangements 100 and 500 may provide versatile flow dynamics to accommodate diverse cooling requirements and pressure drop limits in a compact three-dimensional form factor. The flow diagrams depicted in the above embodiments are only some of the possible dynamics available within the teachings of the embodiments of the present invention. Additionally, three-layer and five-layer embodiments are shown and depicted; however, any number of layers may be used in embodiments of the present invention.

In the above embodiments, the flows through the channels 578 and 584 are in directions that are substantially the same or the opposite. However, other embodiments may have the channels 578 and 584 arranged so that flows through one may be at an angle, e.g., 90 degrees, to the flows through the other. This cross-flow embodiment may help to smooth a temperature gradient along two directions.

Figure 9:
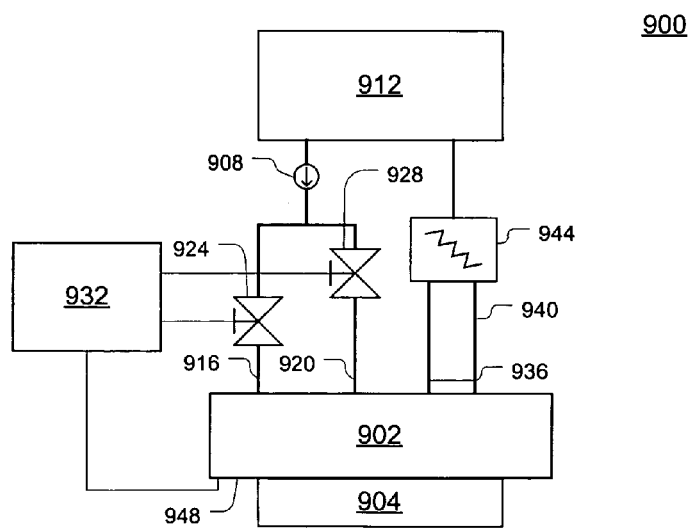
FIG. 9 illustrates a block diagram of an electronic assembly including a thermal management arrangement in accordance with an embodiment of this invention.

FIG. 9 illustrates a block diagram of an electronic assembly 900 including a thermal management arrangement 902 in accordance with an embodiment of this invention. In this embodiment the thermal management arrangement 902 may be coupled to a semiconductor package 904 in order to facilitate the management of excess heat generated by the semiconductor package 904.

The semiconductor package 904 could include an integrated circuit, which may be formed in a rectangular piece of semiconductor material called a chip or a die. Examples of the semiconductor material include, but are not limited to silicon, silicon on sapphire, and gallium arsenide. In various embodiments, the semiconductor package 904 may be a processor, an opto-electronic device, a controller, or some other electronic device.

The thermal management arrangement 902 may include a number of layers having features designed to thermally couple a cooling fluid to the semiconductor package 904 to allow the cooling fluid to absorb at least a portion of the excess heat generated by the semiconductor package 904. The thermal management arrangement 902 may be substantially similar to, and interchangeable with, either the thermal management arrangement 100 or the thermal management arrangement 500.

In one embodiment, a thermal management arrangement 902 may be coupled to the semiconductor package 904 with a thermal interface material in order to decrease the conductive resistance between the two components. Examples of types of thermal interface materials include, but are not limited to, a thin layer of solder paste, phase-change materials, thermal adhesives (e.g., a highly filled epoxy or acrylic), double-sided thermal tape, and thermal interface pads. In another embodiment, the thermal management arrangement 902 may be coupled to an integrated heat spreader (not show) that is thermally coupled to the semiconductor package 904.

In one embodiment a pump 908 may be coupled to a fluid reservoir 912 and may be used to create a pressure differential to facilitate fluid flow through a line. The line may be coupled to two inlet hoses 916 and 920 each having an associated flow-control device, such as valve 924 and 928, respectively. A controller 932 may be coupled to the valves 924 and 928 which may control the valves 924 and 928 to adjust the volumetric flow rates through the inlet hoses 916 and 920.

The fluid flows from the inlet hoses 916 and 920 may be provided to the thermal management arrangement 902 as influent flows. Each of the fluid flows may be individually routed through the thermal management arrangement 902. In particular, one fluid flow may be routed through channels of one layer, while another fluid flow may be routed through channels of another layer. Each of the fluid flows may absorb at least a portion of the excess heat dissipated from the semiconductor package 904 during operation as they travel their respective paths through the thermal management arrangement 902. The heated fluid flows may flow out outlet hoses 936 and 940 and to a heat sink such as a remote heat exchanger 944. Excess heat may be dissipated at the remote heat exchanger 944 and the fluid may be returned to the fluid reservoir 912.

In one embodiment, one or more thermal sensors 948 may be coupled to a surface of the thermal management arrangement 902. The thermal sensors 948 may record temperature range over the surface of the thermal management arrangement 902 and feed the results back to the controller 932. Based at least in part on these results, the controller 932 may adjust the volumetric flow rates output by the valves 924 and/or 928. In such a manner, the controller 932 may facilitate active control of the semiconductor package 904 temperature and fine-tune the cooling parameters based on feedback provided by the thermal sensors 948.

Figure 10:
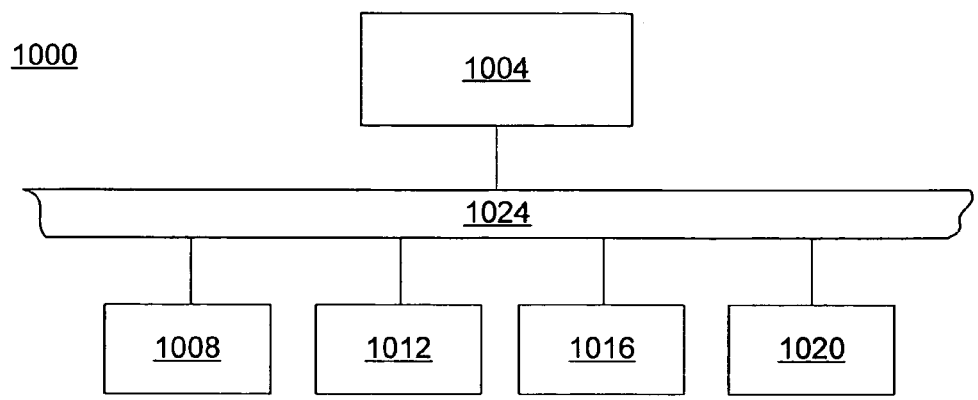
FIG. 10 illustrates a system including a thermally-managed electronic assembly in accordance with an embodiment of the present invention.

FIG. 10 illustrates a system 1000 including a thermally-managed electronic assembly 1004 in accordance with an embodiment of the present invention. The thermally-managed electronic assembly 1004 may be similar to the electronic assembly 900 depicted in FIG. 9. In one embodiment, the electronic assembly 1004 may include a microprocessor. In an alternate embodiment, the electronic assembly 1004 may include an application specific IC (ASIC). Integrated circuits found in chipsets (e.g., graphics, sound, and control chipsets) may also be packaged in accordance with embodiments of this invention.

The system 1000 may include a main memory, a graphics processor 1012, a mass storage device 1016, and an input/output module 1020 coupled to each other by way of an interconnect 1024, as shown. An example of the memory 1008 includes but is not limited to dynamic random access memory (DRAM). Examples of the mass storage device 1016 include but are not limited to a hard disk drive, a flash drive, a compact disk drive (CD), a digital versatile disk drive (DVD), and so forth. Examples of the input/output modules 1020 include but are not limited to a keyboard, cursor control devices, a display, a network interface, and so forth. Examples of the interconnect 1024 include but are not limited to a peripheral control interface (PCI) bus, and Industry Standard Architecture (ISA) bus, and so forth. In various embodiments, the system 1000 may be a notebook-computing device, an enterprise-computing device, or a desktop computer.

In various embodiments, a layered thermal management arrangement may also be used to manage heat produced in non-computing environments. For example, a thermal management arrangement may be coupled to a power amplifier to facilitate dissipation of excessive heat.

Figure 11:
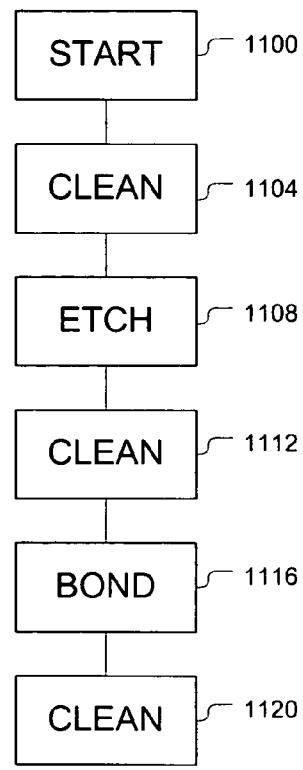
FIG. 11 illustrates a method of manufacturing a layered thermal management arrangement in accordance with an embodiment of the present invention.

FIG. 11 illustrates a method of manufacturing a layered thermal management arrangement in accordance with an embodiment of the present invention. At the start 1100 of the manufacture process a substrate layer, e.g., a silicon wafer, may be cleaned 1104. Further reference to materials and manufacturing processes may largely be determined by the selection of a silicon wafer as the substrate layer. The materials and manufacturing processes of embodiments with substrate layers of other materials may be adjusted accordingly.

The features of the silicon wafer, e.g., the flow-regulation features, channels, and openings, may be defined in an etching 1108, such as, but not limited to, deep reactive ion etching (DRIE). To protect the areas without the features, masking layers, e.g., silicon dioxide, and photoresist may be first deposited. These layers may then be patterned and etched to define the etching window for the actual features. For etching features of different depths, a multi-step etch may be used. In one embodiment, in order to fabricate an opening, a back-side etch may be used following a front-side etch that defines the other features and a first portion of the opening. Following the etch, the silicon wafer may be cleaned again with a cleaning solution to remove organic and metallic contaminates prior to bonding 1112.

In one embodiment, silicon wafer may be bonded into a stack of other silicon wafers by silicon-to-silicon direct bonding, which may also called fusion bonding 1116. A titanium/platinum Ti/Pt thin film may then be deposited on the back side of the stack to provide for temperature sensing. In one embodiment a two-step annealing process may be used to finalize the bonding process. First, the stack may be heated to around 500° C. and pressure may be applied for a duration, e.g., eight hours. The stack may then be cooled down in air.

After cleaning, the stack may be annealed inside a furnace with $N_2$ flow at about 1100° C. for about one hour. In various embodiments, the bonding of the silicon layers to one another may provide for mechanical strength, hermetic seals, and favorable thermal contact.

After the stack has been formed, individual thermal management arrangements may be cut from the wafer 1120.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A system comprising:
    a thermal management arrangement including:
        a first substrate layer having a plurality of first channels with a first end and a second end in a first plane,
        a second substrate layer, coupled to the first substrate layer, having one or more flow-regulation features adapted to provide and regulate at least a portion of a first fluid flow to the plurality of first channels and to drain at least the portion of the first fluid flow from the plurality of first channels,
        the one or more flow-regulation features having a first manifold with a first end and a second end, the first manifold located in a second plane that is substantially parallel to the first plane, adapted to diffuse the first fluid flow from the first end of the first manifold to the second end of the first manifold in the second plane, and to provide the first fluid flow to the plurality of first channels at the first end of the plurality of first channels in the first plane,
        a third substrate layer including one or more flow-regulation features, coupled to the second substrate layer, having a first opening adapted to provide the first fluid flow to the one or more flow-regulation features, and a second opening adapted to drain the first fluid flow from the one or more flow-regulation features,
        a fourth substrate layer, coupled to the first substrate layer, having a second channel, and
        the one or more flow-regulation features of the third substrate layer adapted to provide and regulate at least a portion of a second fluid flow to the second channel and to drain at least the portion of the second fluid flow from the second channel; and
    a flow controller coupled to a first flow control device adapted to control a first flow rate of the first fluid, and coupled to a second flow control device adapted to control a second flow rate of the second fluid flow.

2. The system of claim 1, wherein the one or more flow-regulation features further comprise:
    a second manifold located in the second plane, adapted to drain the first fluid flow from the plurality of first channels, and to concentrate the first fluid flow in the second plane.

3. The system of claim 2, wherein the first manifold is adapted to provide the first fluid flow to the plurality of first channels in a direction that is substantially orthogonal to the second plane, and the second manifold is adapted to drain the first fluid flow from the plurality of first channels in a direction that is substantially orthogonal to the second plane.

4. The system of claim 1, wherein at least a subset of the plurality of first channels are substantially parallel to one another.

5. The system of claim 1, wherein the one or more flow regulation features comprise one or more flow corridors each separated by a rib.

6. The system of claim 1, further comprising:
    a fifth substrate layer, coupled to the third substrate layer, having
        a first opening adapted to provide the first fluid flow to the one or more flow-regulation features of the second substrate layer through the first opening of the third substrate layer;
        a second opening adapted to drain the first fluid flow from the one or more flow-regulation features of the second substrate layer through the second opening of the third substrate layer;
        a third opening adapted to provide the second fluid flow to the one or more flow-regulation features of the third substrate layer; and
        a fourth opening adapted to drain the second fluid flow from the one or more flow-regulation features of the third substrate layer, wherein
    the flow controller being adapted to control the first flow rate of the first fluid flow provided to the first opening of the fifth substrate layer and to control the second flow rate of the second fluid flow provided to the third opening of the fifth substrate layer.

7. The system of claim 6, wherein the first fluid flow is independent from the second fluid flow.

8. The system of claim 1, wherein at least the first substrate layer or the second substrate layer comprises silicon.

9. A method of thermal management comprising:
    receiving a first fluid flow with a first set of flow regulation features of a first substrate layer;
    diffusing the first fluid flow from a first end to a second end of the first set of flow regulation features in a first plane, with the first set of flow regulation features located in the first plane;
    providing the first fluid flow from the first set of flow regulation features to one end of a plurality of first channels in a second substrate layer, the plurality of first channels being in a second plane that is substantially parallel to the first plane;
    draining the first fluid flow from the plurality of first channels with a second set of flow regulation features of the first substrate layer;
    receiving a second fluid flow with a third set of flow regulation features of a third layer that is coupled to the first layer;
    diffusing the second fluid flow with the third set of flow regulation features in a third plane;
    providing the second fluid flow from the third set of flow regulation features to a plurality of second channels in a fourth substrate layer that is coupled to the second substrate layer, the plurality of second channels being in a fourth plane that is substantially parallel to the third plane;
    controlling a first flow rate of the first fluid flow with a first flow control device coupled to a flow controller; and
    controlling a second flow rate of the second fluid flow with a second flow control device coupled to the controller.

10. The method of claim 9, further comprising:
    concentrating the first fluid flow with the second set of flow regulation features located in the first plane.

11. The method of claim 10, further comprising:
emitting the first fluid flow from the second set of flow regulation features in a direction that is substantially orthogonal to the first plane.

12. The method of claim 9, further comprising:
draining the second fluid flow from the plurality of second channels with a fourth set of flow regulation features of the third layer.

13. The method of claim 12 wherein the first fluid flow in the plurality of first channels has a first direction and the second fluid flow in the plurality of second channels has a second direction, and the first direction is substantially the same or substantially the opposite as the second direction.

14. The method of claim 13, wherein the first fluid flow is independent from the second fluid flow.

15. A system comprising:
a thermally-managed electronic assembly including
a semiconductor package to source heat when in operation; and
a thermal management arrangement, coupled to the semiconductor package, having
a first substrate layer including a first channel;
a second substrate layer, coupled to the first substrate layer, having one or more flow-regulation features adapted to provide and regulate a first fluid flow to the first channel and to drain the first fluid flow from the first channel, the first fluid flow adapted to absorb at least a portion of the heat sourced by the semiconductor package while in the first channel;
a third substrate layer, coupled to the second substrate layer, having
a first opening adapted to provide the first fluid flow to the one or more flow-regulation features of the second substrate layer;
a second opening adapted to drain the first fluid flow from the one or more flow-regulation features of the second substrate layer; and
one or more flow-regulation features;
a fourth substrate layer, coupled to the first substrate layer, having a second channel; and
a fifth substrate layer, coupled to the third substrate layer, having
a first opening adapted to provide the first fluid flow to the one or more flow-regulation features of the second substrate layer through the first opening of the third substrate layer;
a second opening adapted to drain the first fluid flow from the one or more flow-regulation features of the second substrate layer through the second opening of the third substrate layer;
a third opening adapted to provide a second fluid flow to the one or more flow-regulation features of the third substrate layer; and
a fourth opening adapted to drain the second fluid flow from the one or more flow-regulation features of the third substrate layer;
a dynamic random access memory (DRAM) coupled to the thermally-managed electronic assembly through an interconnection; and
a flow controller coupled to a first flow control device adapted to control a first flow rate of the first fluid flow provided to the first opening of the fifth substrate layer; and coupled to a second flow control device adapted to control a second flow rate of the second fluid flow provided to the third opening of the fifth substrate layer.

16. The system of claim 15, wherein the first substrate layer including the first channel in a first plane, and the thermal management arrangement further comprises the one or more flow-regulation features having a first manifold located in a second plane that is substantially parallel to the first plane, adapted to diffuse the first fluid flow in the second plane, and to provide the first fluid flow to the first channel.

17. The system of claim 16, wherein the thermal management arrangement further comprises the one or more flow-regulation features of the third substrate layer adapted to provide and regulate the second fluid flow to the second channel and to drain the second fluid flow from the second channel.

18. The system of claim 15, further comprising:
a thermal sensor coupled to a face of the thermal management arrangement to sense thermal conditions; and
the flow controller further coupled to the thermal sensor and adapted to receive the sensed thermal conditions and to control the first flow rate and the second flow rate based at least in part on the sensed thermal conditions.

* * * * *